United States Patent [19]

Dorris et al.

[11] Patent Number: 5,468,566
[45] Date of Patent: Nov. 21, 1995

[54] SYNTHESIS OF HIGHLY PHASE PURE BSCCO SUPERCONDUCTORS

[75] Inventors: Stephen E. Dorris, La Grange Park; Roger B. Poeppel, Glen Ellyn, both of Ill.; Barton C. Prorok, Harrisville, Pa.; Michael T. Lanagan, Woodridge; Victor A. Maroni, Naperville, both of Ill.

[73] Assignee: University of Chicago, Chicago, Ill.

[21] Appl. No.: 305,272

[22] Filed: Sep. 13, 1994

Related U.S. Application Data

[62] Division of Ser. No. 43,652, Apr. 6, 1993, Pat. No. 5,354,535.

[51] Int. Cl.$^6$ .............................. B22F 7/00; H01B 12/04
[52] U.S. Cl. ..................... 428/552; 428/546; 428/551; 505/121; 505/823
[58] Field of Search .................... 428/546, 551, 428/552; 505/121, 823

[56] References Cited

U.S. PATENT DOCUMENTS

| | | | |
|---|---|---|---|
| 5,057,488 | 10/1991 | Arendt et al. | 505/1 |
| 5,147,848 | 9/1992 | Chang et al. | 505/1 |
| 5,204,316 | 4/1993 | Arendt et al. | 505/1 |
| 5,236,891 | 8/1993 | Hikata et al. | 505/1 |
| 5,246,917 | 9/1993 | Hikata et al. | 505/1 |
| 5,324,712 | 6/1994 | Su | 505/492 |
| 5,356,871 | 10/1994 | Bobo et al. | 505/420 |

OTHER PUBLICATIONS

"An Alternate preparation for $(Bi,Pb)_2Ca_2Sr_2Cu_3O_x$", R. H. Arendt et al, Physica C176 (1991) 126–130.

"The fabrication of high critical current capability bismuth superconductor tape", R. H. Arendt et al., Physica C194, 383 (1992).

Primary Examiner—Donald P. Walsh
Assistant Examiner—John N. Greaves
Attorney, Agent, or Firm—Reinhart, Boerner, Van Deuren, Norris & Rieselbach

[57] ABSTRACT

An article and method of manufacture of (Bi, Pb)-Sr-Ca-Cu-O superconductor. The superconductor is manufactured by preparing a first powdered mixture of bismuth oxide, lead oxide, strontium carbonate, calcium carbonate and copper oxide. A second powdered mixture is then prepared of strontium carbonate, calcium carbonate and copper oxide. The mixtures are calcined separately with the two mixtures then combined. The resulting combined mixture is then subjected to a powder in tube deformation and thermal processing to produce a substantially phase pure (Bi, Pb)-Sr-Ca-Cu-O superconductor.

19 Claims, 4 Drawing Sheets

SYNTHESIS OF HIGHLY PHASE PURE BSCCO SUPERCONDUCTORS

The United States Government has rights in this invention pursuant to Contract W-31-109-ENG-38 between the U.S. Department of Energy and the University of Chicago. This application is a divisional of application Ser. No. 08/043652 filed Apr. 6, 1993 now U.S. Pat. No. 5,354,535.

The present invention is concerned generally with an article of manufacture and method of preparing a high temperature superconductor. More particularly, the invention is concerned with a two step process of preparing a substantially phase pure (Bi,Pb)-Sr-Ca-Cu-O superconductor.

High temperature superconductor materials show great promise for usage in numerous technologies. However, in order to make practical use of such materials, substantial improvements in electrical performance must be achieved. For example, large scale applications of high temperature superconductors generally require a critical cuffera density ($J_c$) of about $10^4$ amps/cm$^2$ which is sustainable in magnet fields of at least one Tesla. In addition to such electrical performance characteristics, the superconductor must exhibit mechanical reliability and chemical and cryogenic stability.

One of the most promising methods of manufacturing high temperature superconductors is the "powder in tube" method wherein the ceramic powder constituents of the superconductor are loaded into a silver tube, the tube is sealed; and the powder in tube is then swaged, rolled or drawn into a desired shape. Heat treatment is used to sinter the ceramic powders, and a sheathed superconducting wire is obtained. While this technique has produced superconductor (Bi,Pb)-Sr-Ca-Cu-O materials, the approach has produced a multiphase ceramic, with the primary phase being the properly proportioned (Bi,Pb)-Sr-Ca-Cu-O superconductor, that is, $((Bi,Pb)_2-Sr_2-Ca_2-Cu_3-O_{10})$. However, the presence of variable amounts of other nonsuperconducting phases is indicative of a lack of quality control and reproducibility in the manufacture of the subject high temperature superconductor.

It is therefore an object of the invention to provide an improved article of manufacture and method of making a substantially phase pure (Bi,Pb)-Sr-Ca-Cu-O superconductor.

It is another object of the invention to provide a novel article of manufacture and method of producing a (Bi,Pb) rich (Bi,Pb)-Sr-Ca-Cu-O superconductor.

It is a further object of the invention to provide an improved two step method of preparing a (Bi,Pb) rich (Bi,Pb)-Sr-Ca-Cu-O superconductor.

It is yet another object of the invention to provide a novel method of preparing a (Bi,Pb)-Sr-Ca-Cu-O superconductor adding PbO in the first step of a two step process.

It is still a further object of the invention to provide an improved method of making a highly stable composition of $(Bi,Pb)_2Sr_2Ca_2Cu_3O_x$ superconductor.

It is also an object of the invention to provide a novel method of making a (Bi,Pb)-Sr-Ca-Cu-O superconductor without detrimental loss of Pb content.

It is another object of the invention to provide a novel method of making a (Bi,Pb)-Sr-Ca-Cu-O superconductors by combining Pb with a $Bi_2Sr_2Ca_1Cu_2O_x$ phase to form the superconductor.

It is an additional object of the invention to provide an improved method of making a (Bi,Pb)-Sr-Ca-Cu-O superconductor by forming calcium plumbate ($Ca_2PbO_4$) with a $Bi_2Sr_2Ca_1Cu_2O_x$ phase.

It is yet another object of the invention to provide novel method of making a (Bi,Pb)-Sr-Ca-Cu-O superconductor by controlling formation of a transient liquid phase, using calcium rich $Bi_2Sr_2Ca_1Cu_2O_x$ and lowering the melting point of $Bi_2Sr_2Ca_1Cu_2O_x$.

These objects and other advantages of the invention will be readily apparent from the following description of the preferred embodiments thereof, taken in conjunction with the accompanying drawings described hereinbelow.

DETAILED DESCRIPTION OF PREFERRED EMBODIMENTS

Figure 2:
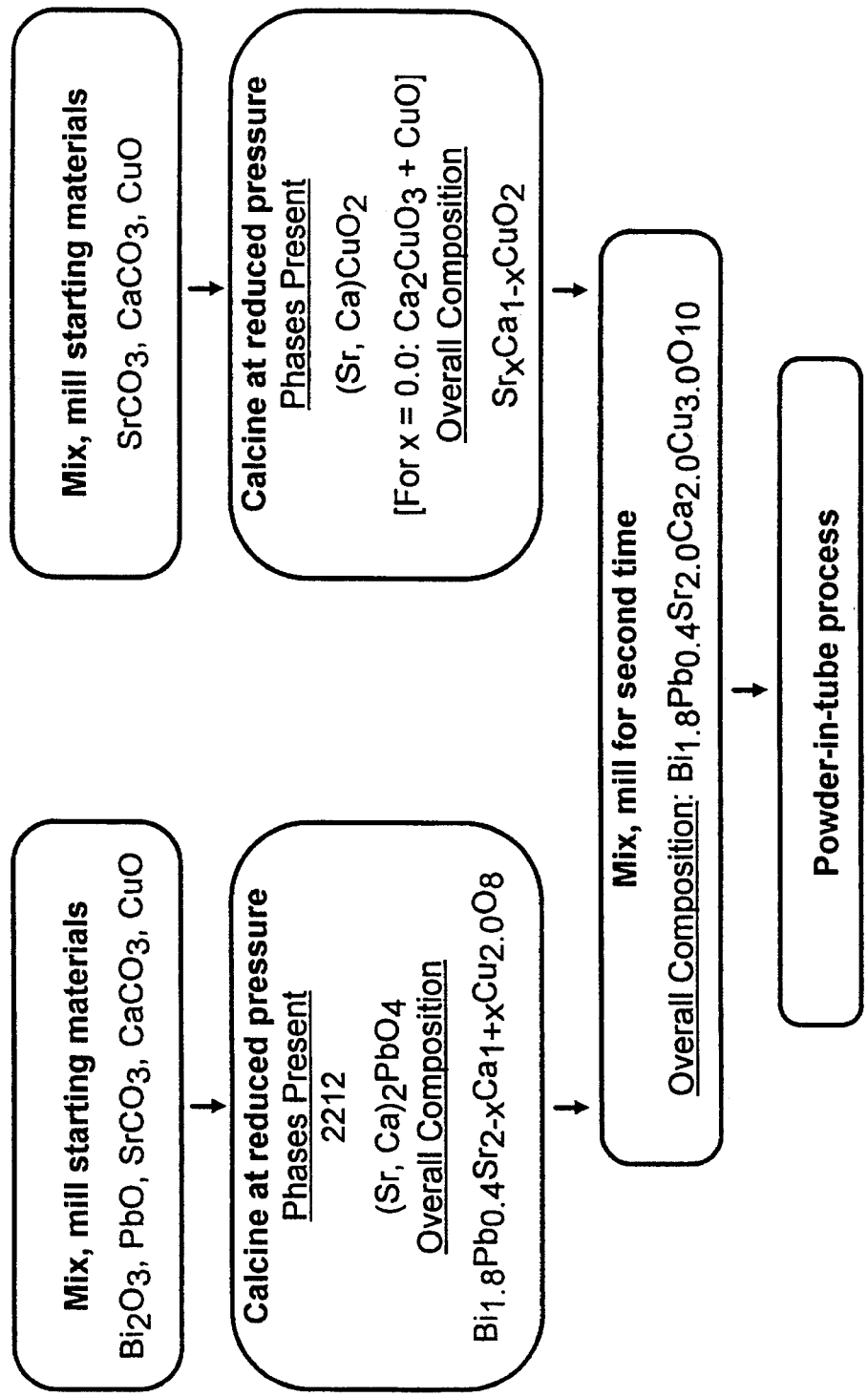
FIG. 2 illustrates one form of the invention of a two step process for preparing a (Bi,Pb)-Sr-Ca-Cu-O superconductor.

A preferred method of preparing a (Bi,Pb)-Sr-Ca-Cu-O superconductor in accordance with the invention is illustrated in FIG. 2. As shown therein a powder mixture of $Bi_2O_3$, PbO, $SrCO_3$, $CaCO_3$ and CuO is combined with a powder mixture of $SrCO_3$, $CaCO_3$ and CuO. Each of these mixtures is calcined separately using conventional calcining temperatures and times (for example, 840° C.–900° C., at times of 24–48 h). The calcination was preferably first carried out at reduced total $O_2$ pressures of about 3 torr, followed by final heating in ambient pressure $CO_2$ free air. These two separate calcinations result in forming two intermediate phases: (1) a lead doped "2212" phase (nominally, $(Bi,Pb)_2Sr_{2-x}Ca_{1+x}Cu_2O_8$) and (2) a strontium/calcium cuprate phase (nominally $Sr_xCa_{1-x}CuO_2$). These two intermediate phases are mixed in proportions needed to achieve the "2223" phase (nominally, $(Bi,Pb)_2Sr_2Ca_2Cu_3O_{10}$). In addition, it is preferable to mill the combined mixture to insure thorough mixing and good contact of the various constituents of the powder mixture. This mixture is then loaded into tubes of a metal, such as silver. The metal tube also should allow the rolling, swaging or extrusion of the powder mixture while confining the powder in the tube undergoing deformation.

Figure 1:
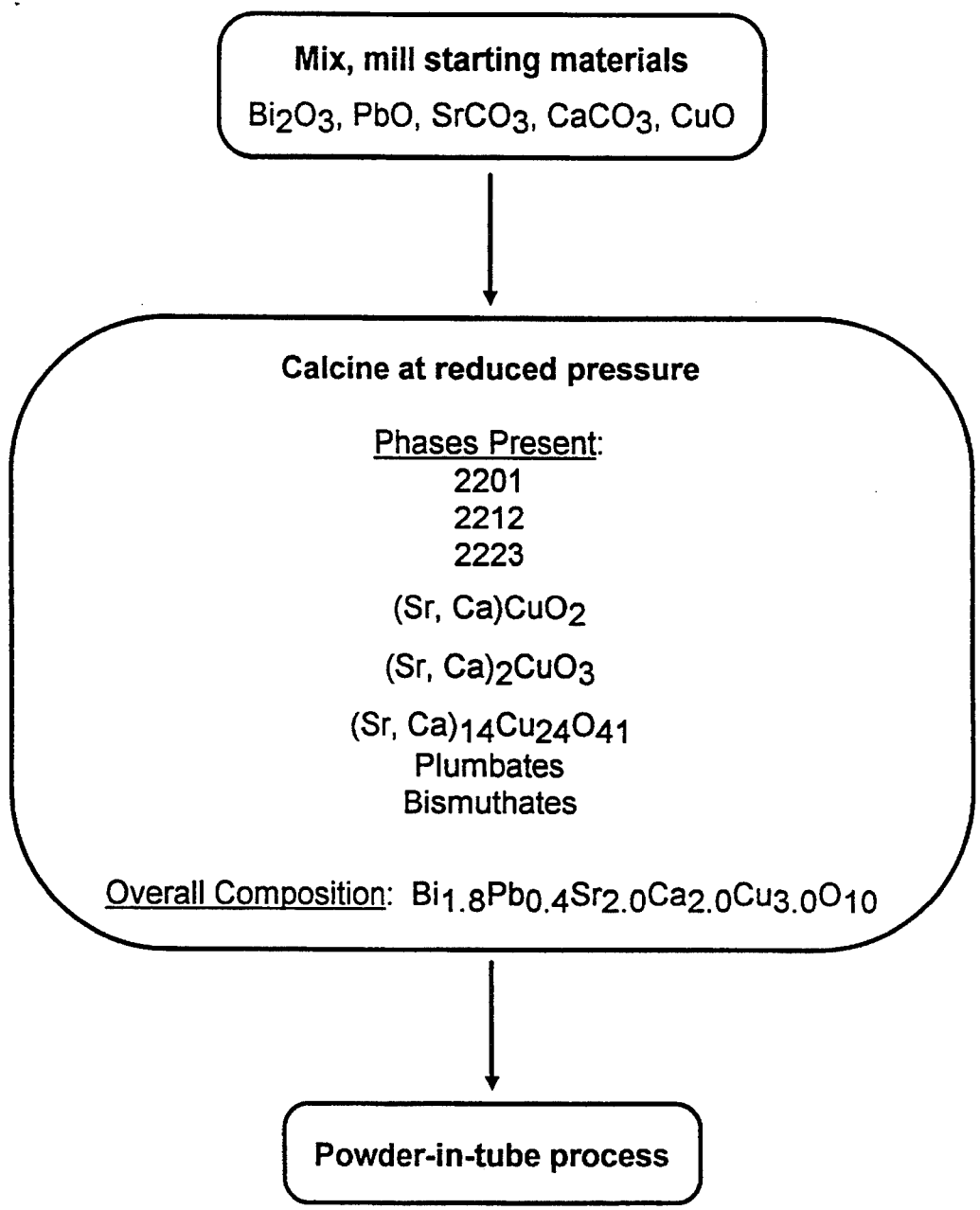
FIG. 1 shows a prior art one step process for preparing a (Bi,Pb)-Sr-Ca-Cu-O superconductor.

Subsequent to performing deformation with a powder in tube process, the deformed product, such as tape or wire, is subjected to heat treatment. Such a heat treatment can be performed in a much shorter time than the conventional one step process. For example, in a preferred embodiment the method of the invention involves heat treatment at about 810°–825° C. in 8 percent $O_2$ (or in air with 13 percent $O_2$) for at least about 50 to 350 hours and most preferably 250 hours (or alternatively at 830°–845° C. in air), versus 845° C. in air for 350 hours in the case of the prior art one step process (see FIG. 1).

Figure 3:
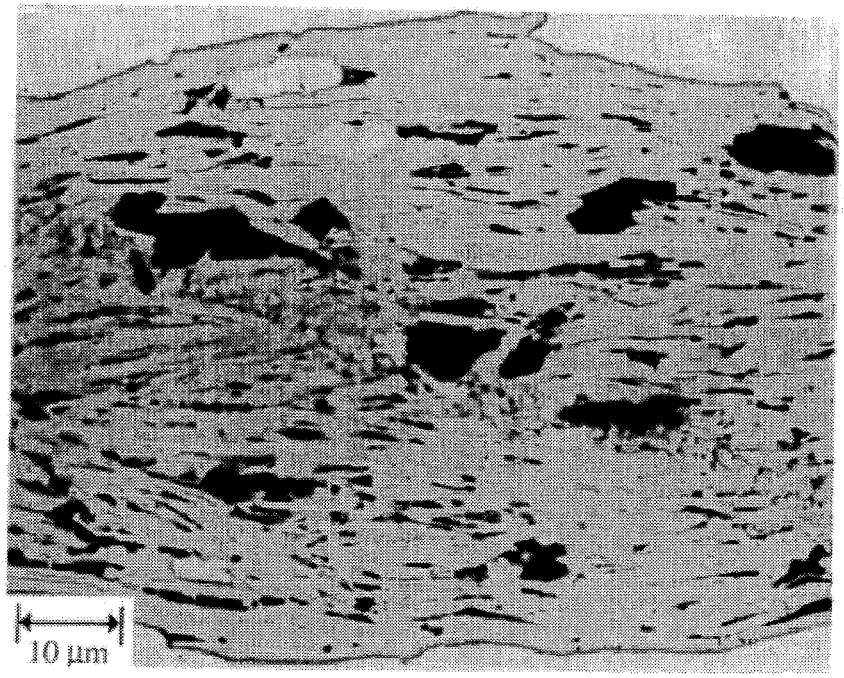
FIG. 3 shows a representative microstructure of a superconductor prepared by the prior art one step process.
Figure 4:
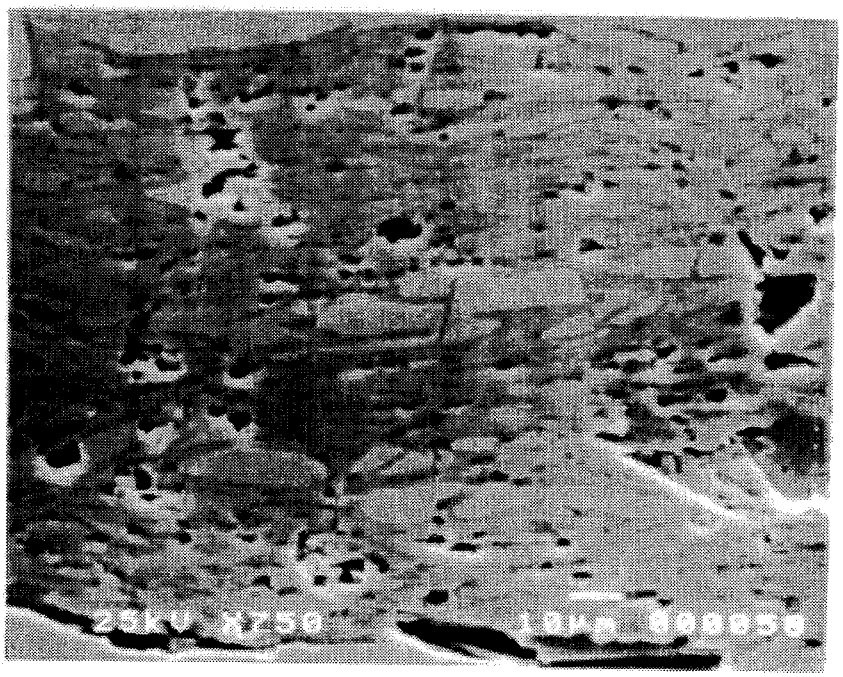
FIG. 4 illustrates a representative microstructure of a superconductor prepared by a two step process of the invention (same magnification as in FIG. 3)

The appearance of the microstructures of a specimen made in accordance with the method of the invention is illustrated in FIG. 4. This can be compared with the microstructure in FIG. 3 of a sample prepared in accordance with the prior art one step process. Substantial amounts of second phases are clearly present in FIG. 3. In FIG. 3 the dark gray major phase is "2223", the light gray regions along the edge are the silver sheath, and the light gray and black phases embedded in the "2223" are second phases ranging up to about ten microns in size and comprise about ten volume percent of the superconducting core. FIG. 4 for the two step process shows light gray regions along the edges which are the silver sheath, the dark gray region is "2223", and the light gray region embedded in the "2223" are silver that was deliberately added to improve the mechanical properties of the tape sample. Similar high phase purity material has been obtained with tapes containing no added silver.

Further processing can also be performed, such as cold pressing product tape at about 2 GPa to give about twenty percent reduction in tape thickness. An annealing step can be repeated until heat treatment times reach about 250 to 350 hours to optimize properties of the product.

In another form of the invention Ag can be added (up to about 20 wt. %) to the intermediate phases described hereinbefore. The powder mixtures with Ag added therein were subsequently processed in the manner detailed previously. Since the Ag lowers the melting point of the 2223 (and also any 2212) phases, the melting point of the Bi-Sr-Ca-Cu-O at the interface with the Ag tube will be lower than that of Bi-Sr-Ca-Cu-O away from the interface unless Ag is added throughout the powder mixture. By addition of Ag throughout the core of powder mixture, more uniform melting of the superconductor core material will result during heat treatment steps. It is also helpful for strength and fracture toughness to add Ag.

In a preferred form of the invention, the composition of the starting materials is adjusted to ensure stabilization of the "2223" phase. This can be accomplished primarily by maintaining the percentage of Pb without much loss during processing. Encapsulation of the powered mixtures within Ag tubing prevents loss by evaporation at the elevated temperatures of processing. Without limiting the scope of the invention, it is believed Pb chemically stabilizes the "2223" phase and enhance the kinetics of forming the "2223" phase. In addition, the total Pb and Bi content is about 2.2 for the most preferred composition (1.8 of Bi and 0.4 of Pb). Since Pb effectively substitutes for Bi, the composition is effectively Bi rich which is believed to be nearer the actual phase pure composition of 2223 and thus assists in stablizing the "2223" phase. The ability to exert such quality control should make easier the task of refining and enhancing the superconductoring properties of the "2223" type of superconductor.

EXAMPLES

The following non-limiting examples demonstrate certain aspects of the method and composition of the invention.

Example 1

A "2223" superconducting compound was prepared by mixing appropriate molar quantities of $Bi_2O_3$, PbO, $SrCO_3$, $CaCO_3$, CuO to form a first batch material and $SrCO_3$, $Ca_2CO_3$ and CuO to form a second batch material. These separate batch mixtures of powders were calcined separately in flowing $O_2$ at reduced total pressure to ensure decomposition of the carbonates. The first batch material was then heated at 840° C. for 24 hours in $CO_2$ free air at ambient pressure and for 48 hours at 900° C. for the second batch material. These calcination treatments formed preferred compositions of $Bi_{1.8}Pb_{0.4}Sr_{2-x}Ca_{1+x}Cu_2O_8$ and $Sr_xCa_{1-x}CuO_2$. These two batch materials are milled separately to a particle size of about 4 microns. The resulting mixtures were combined into a single mixture and milled in isopropanol for 16 h. The slurry was pan dried, and the mixture was then packed into Ag tubes that were drawn and rolled to a final tape dimension thickness of 0.1 mm.

Example II

The specimens prepared in Example I were cut into small samples and heat treated in air at 830°–845° C. or in 8%.$O_2$ at 810°–825° C. A 50h anneal was performed followed by uniaxially cold pressing at 2GPa to yield 20% reduction in tape thickness. The material exhibited a substantially pure microstructure (less than about 2% second phases as noted in measurements from FIG. 4). The tape specimens were then annealed for an additional 100 h, and the process of pressing and heating was repeated until a heat treatment time of 350 h was attained. The properties of the superconductor were measured after each incremental increase of annealing time, and optimum $J_c$ values were obtained for times of about 250 hours to 350 hours of cumulative annealing. For long lengths of wire, rolling can be used instead of cold pressing.

Example III

The specimens prepared in accordance with Example I were tested in a conventional manner to determine $J_c$ which was determined to be about 40,000–50,000 $A/cm^2$.

Example IV

Specimen of (Bi,Pb)-Sr-Ca-Cu-O were prepared in the same basic manner as in Example I but up to 20% by weight Ag was added to the powder mixture of the two intermediate states. The resulting mixture was placed in Ag tubes which were drawn and rolled to produce a final tape thickness of 0.1 mm.

Example V

Specimens of the $Bi_{1.8}P_{0.4}Sr_{2-x}Ca_{1+x}Cu_{2.0}O_8$ intermediate state powders were examined by X-ray diffraction and determined to be nearly single phase "2212" with traces of $Ca_2PbO_4$ for x<0.75, but contained substantial $Ca_2PbO_4$ and "2201" and a slight amount of $Sr_2PbO_4$ for x=0.75-1.0. The other intermediate phase powder $Sr_xCa_{1-x}CuO_2$ was single phase for x>0.25, but contained $Sr_yCa_{2-y}CuO_3$ and CuO for x=0.25 and 0.0.

Example VI

DTA (differential thermal analysis) was performed on powders of each intermediate phase and the mixture of the two. The DTA traces of the two intermediate state powders varied significantly with x, (($Bi,Pb)_2Sr_{2-x}Ca_{1+x}Cu_2O_8$ and $Sr_xCa_{1-x}CuO_2$)) but the DTA trace of the two component mixtures varied only slightly with x, suggesting the reactions in the powder mixtures were quite fast. This was supported by SEM examination which indicated very little second phases were present in the x=0 mixture after only 50 h at 820° C. in 8% $O_2$ (roughly less than 1–2% of second phases, see FIG. 4). Very large regions of second phase were observed in x=1.0 mixture under the same conditions, but the size of the second phase decreased dramatically after a heat treatment time of 150 h.

Example VII

In 8% $O_2$ the highest $J_c$ at 77° K. (about 3.0–4.0× $10^4$ A/$cm^2$) was obtained with the x=0 mixture after 250 h at 815° C. $J_c$ values for the other samples under the same conditions ranged down to 0.8×$10^4$ A/$cm^2$ for the x=1.0 sample. The highest $J_c$ for samples processed in air, 1.3×$10^4$ A/$cm^2$ was also obtained with the x=0 sample.

Example VIII

Figure 5:
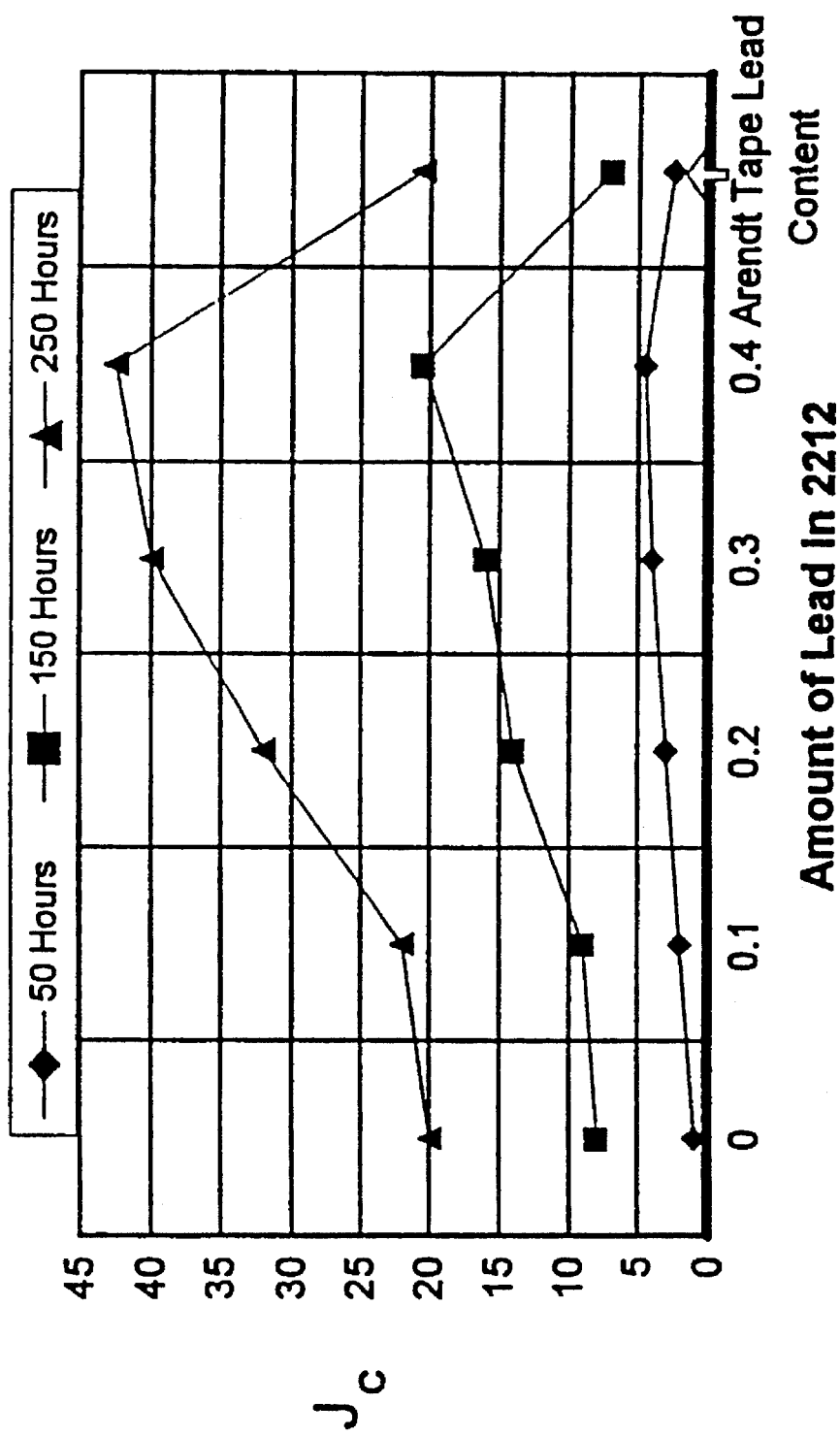
FIG. 5 illustrates the variation of critical current density as a function of Pb content in the 2212 precursor phase.

A set of "2223" superconducting compounds were prepared by mixing appropriate molar quantities of $Bi_2O_3$, $SrCO_3$, $CaCO_3$, CuO; and various amounts of lead oxide ranging from 0 to 0.4 molar fractions were used to form a range of subspecimens for a first batch material. The first batch materials thus consisted of 2212 with varying Pb-content, ranging from 0.0 to 0.4 molar fractions of Pb. A range of subspecimens of second batch material was made by combining $Ca_2CuO_3$, $Ca_2PbO_4$ and CuO. The appropriate first and second batch materials were combined so that each of the mixtures had an identical overall composition, but consisted of different Pb contents in the 2212 phase and different amounts of $Ca_2CuO_3$, $Ca_2PbO_4$ and CuO. The series of mixtures were processed in the same manner as in Example I. Table I below summarizes the various mixtures prepared. The resulting series of superconducting 2223 compounds of varying Pb content were tested to determine the critical current density, and the results are shown in FIG. 5.

TABLE I $Bi_{1.8}Pb_xSr_{2.0}Ca_{1.0}Cu_{2.0}O_8$ Study
Each mixture consisted of: (1.0) $Bi_{1.8}Pb_xSr_{2.0}Ca_{1.0}Cu_{2.0}O_8$ + (0.4 − x) $Ca_2PbO_4$ + (0.1 + x) $Ca_2CuO_3$ + (0.9 − x) CuO.

| x | $Ca_2PbO_4$ | $Ca_2CuO_3$ | CaO | Comments |
|---|---|---|---|---|
| 0.0 | 0.4 | 0.1 | 0.9 | lead-free 2212 |
| 0.1 | 0.3 | 0.2 | 0.8 | |
| 0.2 | 0.2 | 0.3 | 0.7 | |
| 0.3 | 0.1 | 0.4 | 0.6 | |
| 0.4 | "0.0"* | 0.5 | 0.5 | two-step |
| 0.0 | 0.0 | 0.5 | 0.5 | 0.4 PbO |

*$Ca_2PbO_4$ was not deliberately added as in the x = 0.0–0.3 compositions, but a small amount was present, apparently because the solubility limit for Pb in 2212 is ≅ .3.

Five mixtures were made in the "Pb-study" in addition to the sixth composition (the last one in the Table). The overall composition of each mixture is $Bi_{1.8}Pb_{0.4}Sr_{2.0}Ca_{2.0}Cu_{3.0}O_{10}$. Only the relative amounts of the phases present change from mixture to mixture.

What is claimed is:

1. An article of manufacture of 2223 (Bi,Pb)y-Sr-Ca-Cu superconductor comprised of a substantially oxide phase pure 2223 superconductor phase with less than 2–3 percent of any second phase oxide aside from said 2223 superconductor phase and a fractional content y of Bi and Pb together being about 2.1 to 2.3.

2. The article as defined in claim 1 further including Ag as a second nonoxide phase in said superconductor of less than about 20 wt %.

3. The article as defined in claim 1 wherein $J_c$ is about 30,000–40,000 A/$cm^2$.

4. The article as defined in claim 1 manufactured by preparing two separate oxide mixtures.

5. The article as defined in claim 1 manufactured by preparing, separately calcining, and mixing a first powdered mixture including bismuth oxide, lead oxide, strontium carbonate, calcium carbonate and copper oxide and a second powdered mixture including strontium carbonate, calcium carbonate and copper oxide.

6. An article of manufacture of 2223 (Bi,Pb)y-Sr-Ca-Cu-O superconductor less than 2–3 percent of any second phase oxide aside from said 2223 superconductor phase and a fractional content y of Bi and Pb together being about 2.1 to 2.3, said article manufactured by preparing, separately calcining, and mixing a first powdered mixture including bismuth oxide, lead oxide, strontium carbonate, calcium carbonate and copper oxide and a second powdered mixture including strontium carbonate, calcium carbonate and copper oxide, and carrying out a deformation process and thermal process to produce a substantially phase pure 2223 (Bi, Pb)-Sr-Ca-Cu-O article of manufacture.

7. The article of manufacture as defined in claim 6 wherein said first powdered mixture comprises $(Bi,Pb)_ySr_{2-x}Ca_{1+x}Cu_2O_8$ where y is about 2.1–2.3.

8. The article of manufacture as defined in claim 6 wherein said second powdered mixture comprises $Sr_xCa_{1-x}CuO_2$.

9. The article as defined in claim 6 wherein said calcining separately said first and second powdered mixtures is performed to ensure decomposition of carbonates present.

10. The article of manufacture as defined in claim 6 wherein calcining separately comprises heating at reduced total pressure each of said mixtures followed by heating in $CO_2$ free air at ambient pressure for 24 h at 840° C. for said first powdered mixture and 48 h at 900° C. for said second powdered mixture.

11. An article of manufacture of 2223 ($Bi_xPb_y$-$Sr_{2-x}Ca_{1+x}CuO_8$)-Sr-Ca-Cu-O superconductor, consisting essentially of a substantially phase pure form of 2223 superconductor phase wherein y consists essentially of about 0.1–0.4 and the article is prepared by preparing a first powdered mixture of bismuth oxide, strontium carbonate, calcium carbonate, copper oxide and lead oxide and a second powdered mixture of strontium carbonate, calcium carbonate and copper oxide, calcining separately each of said first and second powdered mixtures, mixing said calcined first and second powdered mixtures, and carrying out a deformation process and a thermal process to produce a substantially phase pure 2223 superconductor article of manufacture.

12. The article of manufacture as defined in claim 11 wherein said calcining comprises cumulative heating of about 50–350 hours time.

13. The article of manufacture as defined in claim 12 wherein said time of calcining consists of about 250 h.

14. The article of manufacture as defined in claim 11 further including the step of adding silver up to about 20 wt % to at least one of said first and second powdered mixtures.

15. The article of manufacture as defined in claim 11 wherein said deformation process includes sealing in a silver sheath said mixed and calcined first and second powdered mixtures.

16. The article of manufacture as defined in claim 15 wherein said silver sheath is evacuated before sealing.

17. The article of manufacture as defined in claim 11 wherein said calcining is done in at reduced total pressure.

18. The article of manufacture as defined in claim 11 wherein said thermal process includes annealing at ambient pressures in atmospheres selected from the group consisting of air and 8% to 13% $O_2$ in argon.

19. The article of manufacture as defined in claim 18 wherein said thermal process includes annealing at temperatures of about 830°–845° C. in air and 810°–825° C. in 8% $O_2$.

* * * * *